United States Patent
Gillberg

(10) Patent No.: US 7,365,954 B1
(45) Date of Patent: Apr. 29, 2008

(54) POWER DEVICE PROTECTION CIRCUIT

(75) Inventor: James E. Gillberg, Flemington, NJ (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/207,486

(22) Filed: Aug. 19, 2005

(51) Int. Cl.
*H02H 5/04* (2006.01)
*H02H 7/00* (2006.01)
*H02H 9/00* (2006.01)
*H02H 3/08* (2006.01)
*H02H 9/02* (2006.01)

(52) U.S. Cl. .................. 361/103; 361/18; 361/93.1

(58) Field of Classification Search ............ 361/103, 361/18, 93.1
See application file for complete search history.

(56) References Cited

U.S. PATENT DOCUMENTS 5,351,162 A * 9/1994 Koishikawa .................. 361/18
6,055,149 A * 4/2000 Gillberg et al. ............. 361/103

* cited by examiner

*Primary Examiner*—Michael Sherry
*Assistant Examiner*—Dharti H Patel
(74) *Attorney, Agent, or Firm*—Sidley Austin LLP

(57) ABSTRACT

A protected power device includes a power transistor with an internal control line to receive a control line current and a fault detector, coupled to the internal control line. A power device protection circuit includes a power device driver, coupled to the control line to drive the protected power device, a current sensor, coupled to the control line to sense a fault of the protected power device by monitoring the control line current and to generate a fault-sensing signal, and control logic, coupled to the current sensor and to the power device driver to respond to the fault-sensing signal of the current sensor. The fault detector modifies the control line current upon detecting a fault and the current sensor senses the fault by sensing the modified control line current. The control logic responds to the sensed fault by limiting or shutting down the current of the protected power device.

6 Claims, 6 Drawing Sheets

POWER DEVICE PROTECTION CIRCUIT

BACKGROUND

1. Field of Invention

The present invention relates to power device protection circuits, and more particularly to smart power devices.

2. Description of Related Art

Modern electronic devices need power devices to provide and transform electric power. There is a vast array of power devices at present. Most of these power devices support large currents, which in turn can be hazardous for the power devices themselves. For example, the current causing a temperature to exceed a maximum allowed temperature, or a current to exceed a maximum current can be detrimental for the power device, including causing the burnout of the device. Therefore, in modern circuits the power devices are typically protected against overheating and over-current faults, and other hazardous operating condition.

Existing designs limit the main device current, but they may not shut down the power device. However, in some circumstances, shutting down the power device is the most sensible response to the fault.

In some protected power devices a temperature independent voltage is used to analyze and control the operating characteristics of the power device, such as its temperature. However, the temperature independent voltage is often provided by a circuit on the protected chip, which takes numerous complex mask steps to create.

Other existing designs use additional auxiliary lines, e.g. "flag lines". Using flag lines increases the number of pins, and requires the processing of additional data. Furthermore, often flag lines in discrete power devices generate too small current signals because they utilize parasitic bipolar junction transistors with an amplification factor beta as low as two. Since control circuits are coupled to the flag lines, bigger signals and more current are needed. Also, sensitivity to smaller changes in the control line current would be desirable for more precise, "smart" power management.

Furthermore, often all flag lines are tied in parallel or "wired ored." In such designs it can not be determined, which power transistor had the fault.

For at least the above reasons, developing protected smart power devices is a high priority.

SUMMARY

Briefly and generally, embodiments of the invention include a power device protection circuit, the protected power device comprising a power transistor, having a control terminal; an internal control line, coupled to the control terminal and operable to receive a control line current; and a fault detector, coupled to the internal control line, the power device protection circuit comprising: a power device driver, coupled to a control line, operable to drive the protected power device; a current sensor, coupled to the control line, the current sensor configured to sense a fault of the protected power device by monitoring the control line current, and to generate a fault-sensing signal; and control logic, coupled to the current sensor and to the power device driver, configured to respond to the fault-sensing signal of the current sensor.

In embodiments, the fault detector is configured to modify the control line current upon detecting a fault and the current sensor is configured to sense the fault of the protected power device by sensing the modified control line current. The control logic is configured to respond to the sensed fault of the protected power device by limiting a current of the protected power device, by essentially shutting down the current of the protected power device, or by reporting the fault to another circuit block.

Embodiments of the invention include a method of protecting a power device, the protected power device comprising a power transistor, having a control terminal; a control line, coupled to the control terminal and operable to receive a control line current; and a fault detector, coupled to the control line, the method comprising the steps of: driving the power device through the control line; sensing a fault of the power device by monitoring the control line current; generating a fault-sensing signal; and responding to the fault sensing signal to protect the power device.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention and their advantages are best understood by referring to FIGS. 1-6 of the drawings. Like numerals are used for like and corresponding parts of the various drawings.

Figure 1:
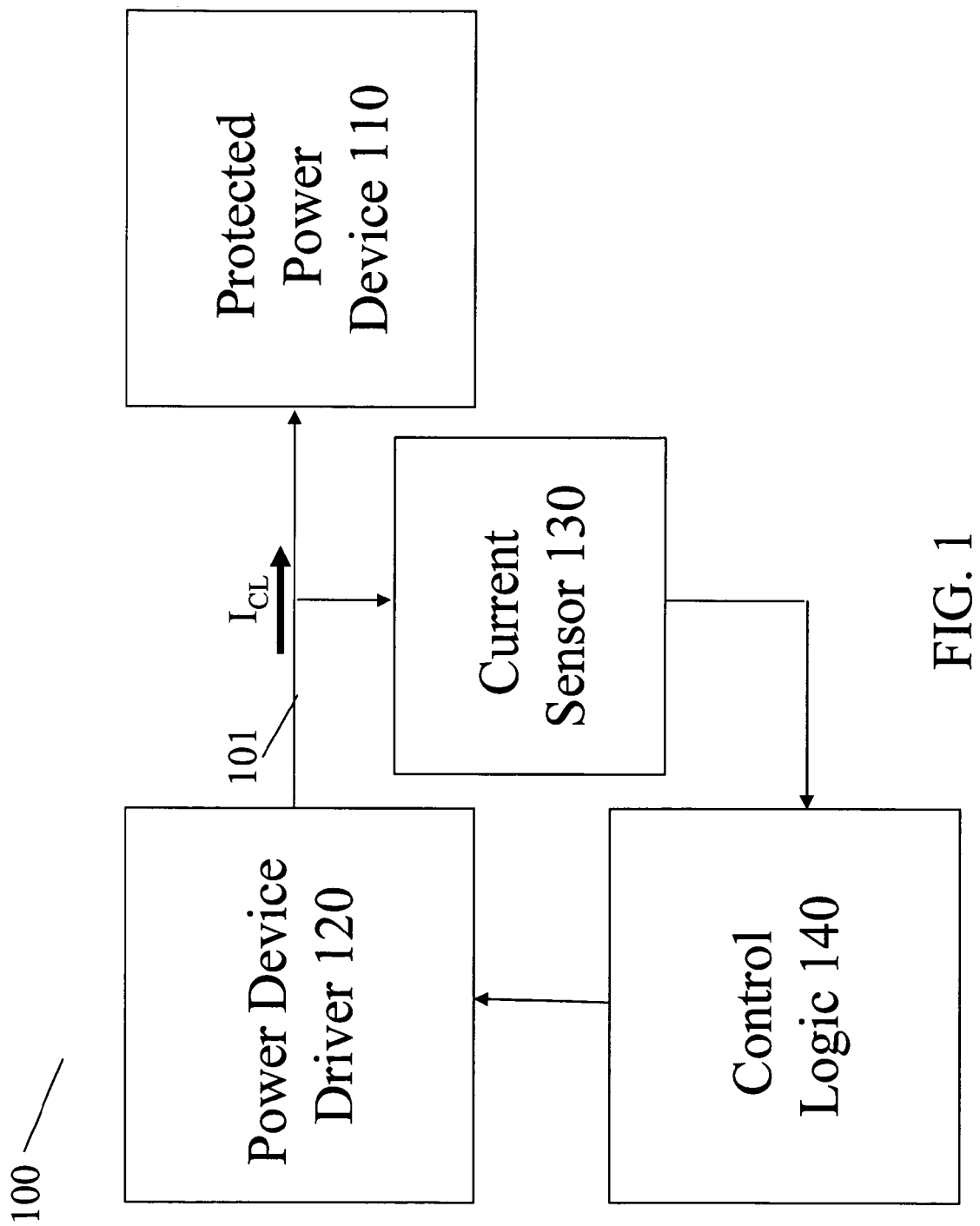
FIG. 1 illustrates a block diagram of a power device protection circuit, according to an embodiment of the invention.

FIG. 1 illustrates a block diagram of a power device protection circuit 100. Protection circuit 100 includes a protected power device 110 and a power device driver 120. Power device driver 120 drives protected power device 110 through control line 101.

Protection circuit 100 also includes a current sensor 130, coupled to control line 101. Current sensor 130 is configured to sense a fault of protected power device 110 by monitoring a control line current $I_{CL}$ in control line 101. When an excess control line current $I_{CL}$ is detected, current sensor 130 generates a fault-sensing signal.

Protection circuit 100 also includes a control logic 140. Control logic 140 is coupled to power device driver 120 and to current sensor 130. Control logic 140 is configured to respond to the fault-sensing signal, generated and sent by current sensor 130.

The fault of protected power device 110 can be a current value, a voltage value or a temperature value of protected power device 110 being outside a predetermined current, voltage or temperature range, respectively. For example, an operating temperature range of the protected power device can be preset to be less than 150 centigrade, 130 centigrade, or 100 centigrade. An operating current value can be less than 1 Ampere or less than 0.1 Ampere. Depending on the application, many different ranges for different values can be set.

Figure 2:
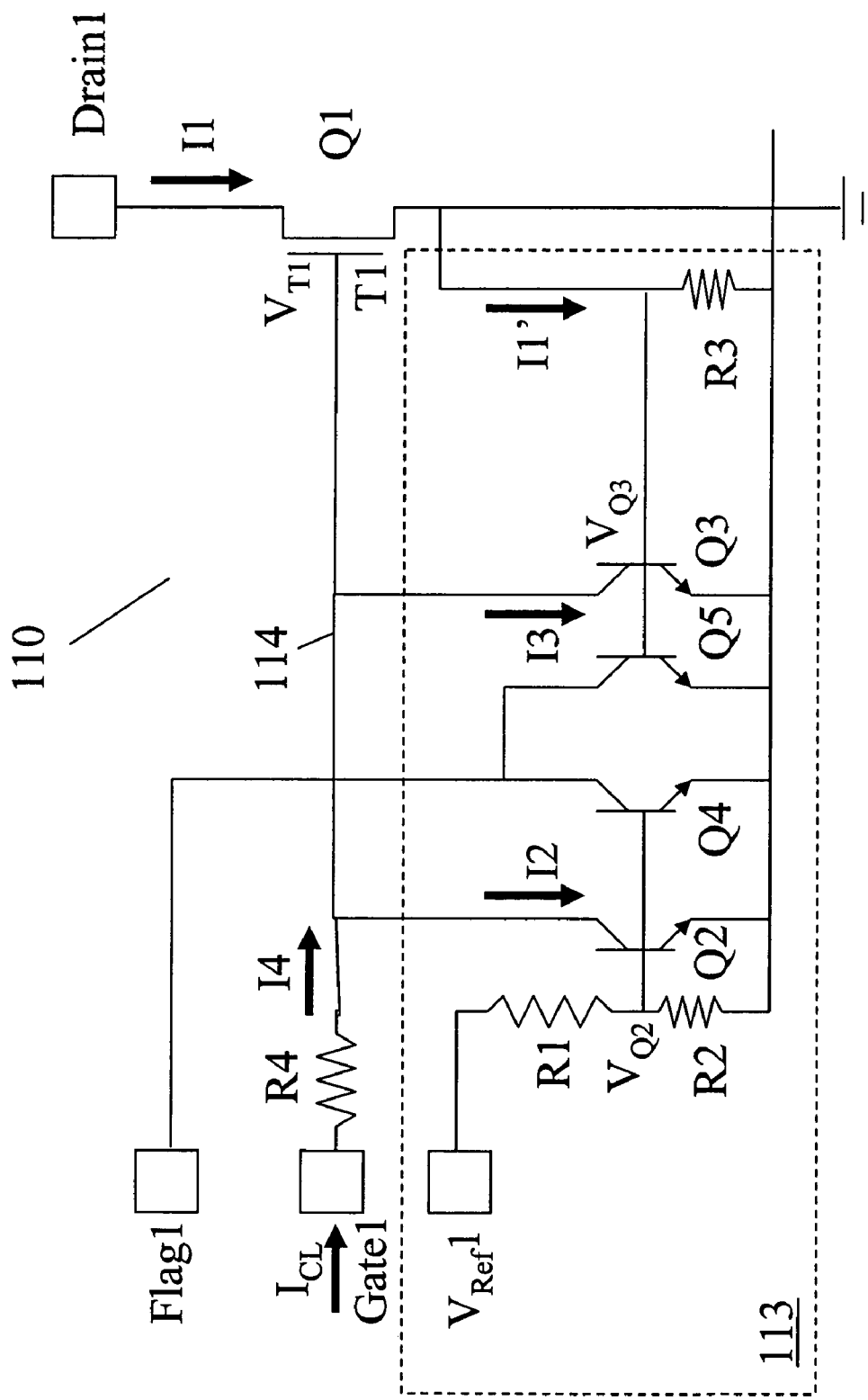
FIG. 2 illustrates an implementation of the protected power device according to an embodiment of the invention.

FIG. 2 is referred to for an illustration of fault conditions. A typical reason of these faults is that a main current I1 of a power transistor Q1 is too high. An excessive main current I1 can overheat power transistor Q1 and its environment, leading to damages. Other reasons for faults include the breakdown of the cooling of power transistor Q1, the overheating of another part of the circuitry, an external device, or the environment. In most of these fault conditions, lowering or shutting off main current I1 of power transistor Q1 is useful to reduce or eliminate the fault and protect the power driver from possible self destruction. Therefore, reducing or shutting off main current I1 in response to a fault-sensing signal is one of the functions of power device protection circuit 100.

FIG. 2 illustrates an embodiment of protected power device 110. A related protected power device was described in U.S. Pat. No. 6,055,149, hereby incorporated in its entirety by reference. Protected power device 110 includes a power transistor Q1 having a control terminal T1. Protected power device can be a MOS FET, in which case control terminal T1 is a gate, or it can be a bipolar transistor, in which case control terminal T1 is a base. Control line 101 is coupled to control terminal T1 through terminal Gate 1, resistor R4, and internal control line 114. Control line 101 applies a control terminal voltage $V_{T1}$ and an internal control line current I4 to control terminal T1. A typical value of control terminal voltage $V_{T1}$ is in the range of 1V-10V, for example, 5V.

Protected power device 110 also includes fault detector 113. Fault detector 113 is configured to protect power transistor Q1 by reducing or shutting off main current I1 upon detecting a fault.

In the process of protecting power transistor Q1, fault detector 113 also modifies internal control line current I4. In the absence of a fault, internal control line current I4 is essentially zero. However, internal control line current I4 is modified to a non-zero value, if fault detector 113 detects a fault.

An embodiment of fault detector 113 includes a thermal sensor, which contains a thermal sensor transistor Q2. The collector of thermal sensor transistor Q2 is coupled to control line 101, the emitter of thermal sensor transistor Q2 is coupled to the ground, and the base of thermal sensor transistor Q2 is coupled to an essentially temperature-independent reference voltage source $V_{Ref}$ through a reference voltage terminal $V_{Ref}$1. In most modern power device circuit environments a temperature-independent voltage source is already present, so requiring an essentially temperature independent voltage $V_{Ref}$ does not impose additional design requirements. In some other embodiments, such a temperature independent voltage source needs to be provided. In some embodiments, the reference voltage $V_{Ref}$ is divided down by two resistors R1 and R2 into a divided reference voltage $V_{Q2}$. In some embodiments, the thermal sensor transistor is a MOS FET.

Thermal sensor transistor Q2 has a base-emitter voltage $V_{be}$ between its base and emitter. $V_{be}^{onset}(T)$ is the critical onset base-emitter voltage of thermal sensor transistor Q2 at temperature T: thermal sensor transistor Q2 turns on at temperature T, if the base-emitter voltage $V_{be}$ is larger than $V_{be}^{onset}(T)$. Divided reference voltage $V_{Q2}$ is divided down from $V_{Ref}$ by resistors R1 and R2 so that during normal operations and within an operating temperature range, thermal sensor transistor Q2 is turned off: $V_{Q2} < V_{be}^{onset}(T)$. Thus, control terminal voltage $V_{T1}$ is controlled by control line 101 and is not influenced by thermal sensor transistor Q2.

When thermal sensor transistor Q2 is turned off, it does not draw thermal sensor current I2 from internal control line 114. Therefore, thermal sensor current I2 and hence control line current I4 are essentially zero.

The base-emitter onset voltage $V_{be}^{onset}(T)$ decreases with increasing temperature. To utilize this fact, in embodiments the value of $V_{Ref}$ or $V_{Q2}$ is chosen such that thermal sensor transistor Q2 is close to turning on. Thus, if the temperature increases, $V_{be}^{onset}(T)$ can eventually decrease below $V_{Q2}$ at some temperature. $V_{Ref}$, or in other embodiments divided reference voltage $V_{Q2}$ are chosen so that $V_{be}^{onset}(T)$ decreases below $V_{Q2}$ at a preset allowed maximum temperature $T_{max}$. $T_{max}$ defines an operating temperature range $T < T_{max}$. The temperature of power transistor Q1 and its environment, including thermal sensor transistor Q2, rising outside the operating temperature range, i.e. $T > T_{max}$ will be referred to as an overheating fault, because the corresponding high temperatures can be damaging to power transistor Q1 and the entire system. A function of power device protection circuit 100 is to sense overheating faults and protect power transistor Q1 and the entire protected power device 110 from such faults.

Embodiments achieve this function in the following manner. If the temperature T increases past $T_{max}$, thermal sensor transistor Q2 turns on since $V_{Q2} = V_{be}^{onset}(T_{max})$. When thermal sensor transistor Q2 turns on, it pulls down control terminal voltage $V_{T1}$. Lowering control terminal voltage $V_{T1}$ reduces main current I1 of power transistor Q1. In some embodiments main current I1 is essentially shut down and power transistor Q1 is turned off. If main current I1 was the source of the overheating fault, reducing or shutting it down, eliminates the source of overheating. If main current I1 was not the source of overheating, turning off power transistor Q1 still reduces the potential damages.

A consequence of thermal sensor transistor Q2 turning on is that thermal sensor current I2 becomes non-zero. The finite value of thermal sensor current I2 drives internal control line current I4, and therefore control line current $I_{CL}$ non-zero as well. Therefore, an overheating fault condition causes protected power device 110 to draw an excess control line current $I_{CL}$ through control line 101. This excess control line current $I_{CL}$ can be utilized by current sensor 130 to sense the overheating fault.

Fault sensing circuit 113 also includes a thermal flag transistor Q4, coupled to flag terminal Flag1. Thermal flag transistor Q4 mirrors the state of thermal sensor transistor Q2. Correspondingly, thermal flag transistor Q4 turns on in response to an overheating fault as well. Therefore, in response to an overheating fault, thermal flag transistor Q4 starts drawing current at flag terminal Flag 1.

In some embodiments, flag terminals of power devices are coupled to a logic circuit, which recognizes the overheating fault from the current drawn at flag terminal Flag1. However, such designs have drawbacks, as described below at least at paragraphs [0046], [0048], and [0064].

In embodiments fault detection circuit 113 includes a current sensor to protect power transistor Q1 against overcurrent faults. Current sensor contains current sensor transistor Q3. The collector of current sensor transistor Q3 is coupled to internal control line 114, the emitter of current sensor transistor Q3 is coupled to the ground, and the base of current sensor transistor Q3 is coupled a resistor R3. Resistor R3 is coupled into a current path of main current I1 of power transistor Q1, configured to sense main current I1.

This current path can be parallel to the main current path of power transistor Q1. In such embodiments, the current I1' across resistor R3 is representative of main current I1.

Similarly to the design of the thermal sensor, the value of resistor R3 is chosen so that if main current I1 is less than a preset critical value $I_{max}$, then current I1' produces a voltage $V_{Q3}$ at resistor R3, which turns off current sensor transistor Q3: $V_{Q3}(I) < V_{be}^{onset}$. However, if main current I1 falls outside a preset range, such as it exceeds the preset maximum current $I_{max}$, then $V_{Q3}(I)$ exceeds $V_{be}^{onset}$, turning on current sensor transistor Q3.

Once turned on, current sensor transistor Q3 pulls down control terminal voltage VT1, reducing or shutting off main current I1. This eliminates the over-current fault and protects power transistor Q1.

A consequence of current sensor transistor Q3 turning on is that current sensor current I3 becomes non-zero. The finite value of current sensor current I3 drives internal control line current I4, and therefore control line current $I_{CL}$ non-zero as well. Therefore, an over-current fault condition causes protected power device 110 to draw an excess control line current $I_{CL}$ through control line 101. This excess control line current $I_{CL}$ can be utilized by current sensor 130 to sense the over-current fault.

Fault sensing circuit 113 also includes a current flag transistor Q5, coupled to flag terminal Flag1. Current flag transistor Q5 mirrors the state of current sensor transistor Q3. Correspondingly, current flag transistor Q5 turns on in response to an over-current fault as well. Therefore, in response to an over-current fault, current flag transistor Q5 starts drawing current at flag terminal Flag 1.

In some embodiments, flag terminals of power devices are coupled to a logic circuit, which recognizes the over-current fault from the current drawn at flag terminal Flag1. However, such designs have drawbacks, as described below at least at paragraphs [0046], [0048], and [0064].

In other embodiments, other fault-detecting circuits are used to detect fault conditions. Such fault conditions include over-voltage faults.

In sum, in embodiments protected power device 110 draws excess control line current $I_{CL}$ in response to a fault. Current sensor 130 senses the fault of protected power device 110 by sensing the excess control line current $I_{CL}$, drawn by fault detector 113 of protected power device 110.

In response to the sensed fault, current sensor 130 generates a fault-sensing signal for control logic 140. Control logic 140 responds to the sensed fault by at lest one of safeguarding protected power device 110 and reporting the sensed fault to another circuit block.

Control logic 140 can safeguard protected power device 110 by limiting the current of power transistor Q1 and essentially shutting down main current I1 of power transistor Q1.

For example, in an embodiment thermal sensor transistor Q2 responds to an overheating fault by turning on, thereby pulling down control terminal voltage $V_{T1}$, and thus reducing main current I1. Turned-on thermal sensor transistor Q2 also draws excess control line current $I_{CL}$. This excess control line current $I_{CL}$ is sensed by current sensor 130 and reported in a fault-sensing signal to control logic 140. In response, control logic 140 pulls down control terminal voltage $V_{T1}$ further, turning off power transistor Q1 and shutting down main current I1 and safeguarding protected power device 110.

The aforementioned embodiments illustrate that protection circuit 100 has the following features in comparison to existing designs.

In previous designs, main current I1 was only reduced by fault-detection circuit 113 and not shut off. In contrast, protection circuit 100 is capable of turning off main current I1 of power transistor Q1 through control logic 140 pulling down control terminal voltage $V_{T1}$.

Further, as thermal and current sensing transistor Q2 and Q3 are often parasitic devices with a low amplification factor beta, they generate small signal currents at flag terminal Flag1. Therefore, in existing designs the various control blocks received only weak signals from flag terminal Flag1, often insufficient for further processing. In contrast, protection circuit 100 generates sufficiently large fault-sensing signals, because current sensor 130 includes dedicated transistors, which are capable of generating sufficiently large fault-sensing signals.

For the same reason, existing designs have low sensitivity to changes in control line current $I_{CL}$. In contrast, protection circuit 100 is sensitive to quite small changes in control line current $I_{CL}$.

Also, in existing designs the fault-detection was indicated by a signal at flag terminal Flag1. Processing this fault-detection signal necessitated additional external lines and circuitry. In contrast, some embodiments of protection circuit 100 detect faults through the already existing gate terminal Gate1, without using flag terminal Flag1, thereby eliminating the need of additional external lines and circuitry and keeping the number of pins lower.

Also, existing designs often have a temperature independent voltage source, or band-gap reference circuit, on the chip of the protected power device. Creating such a band-gap reference circuit requires complex lithographic processes and numerous production steps. In contrast, protection circuit 100 receives a thermally stable voltage from an external source. Thus manufacturing protection circuit 100 requires fewer and less complex mask steps.

Figure 3:
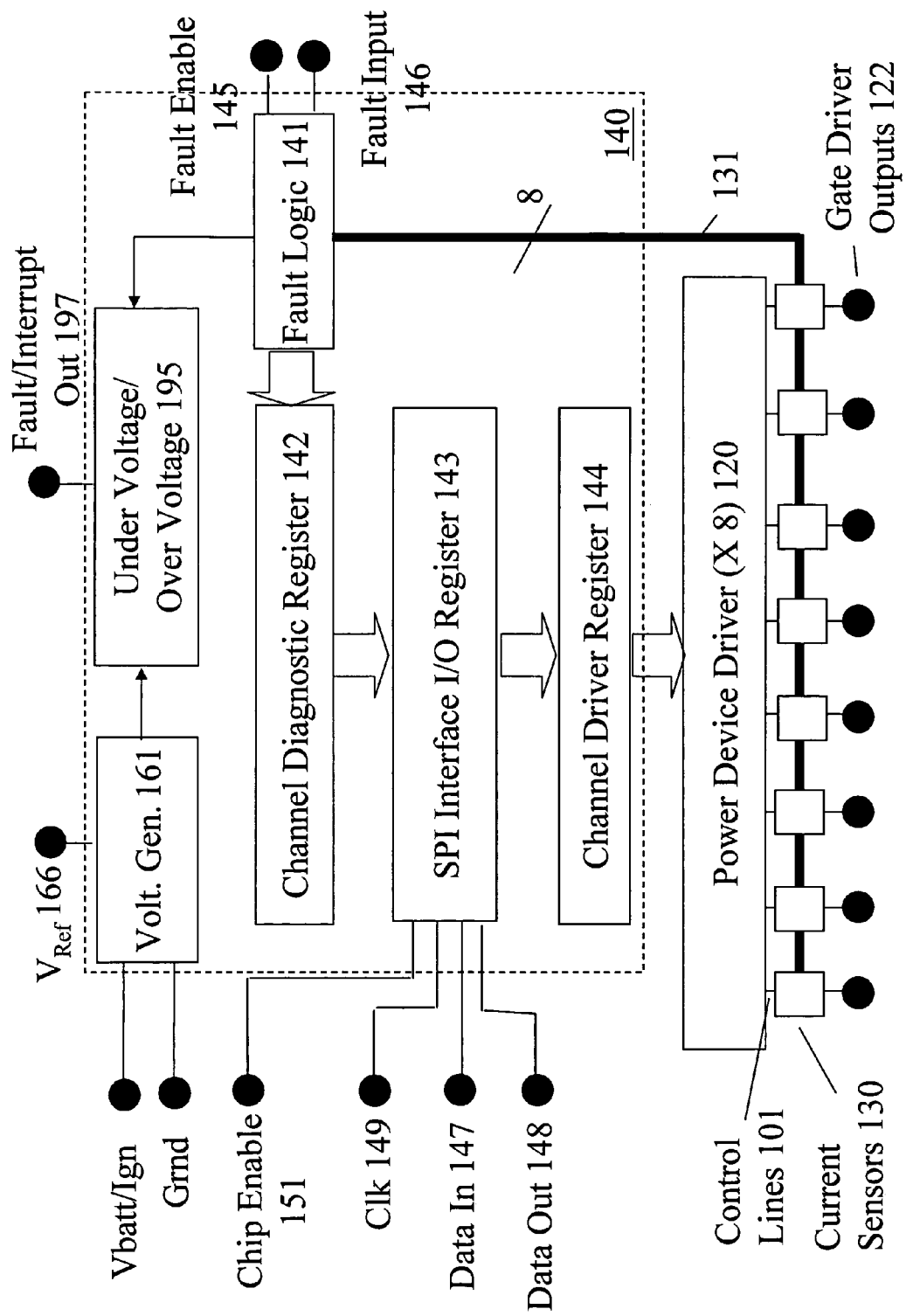
FIG. 3 illustrates an implementation of the power device protection circuit according to an embodiment of the invention.

FIG. 3 illustrates an embodiment, where power device driver 120 drives eight protected power devices 110-1, . . . 110-8, through Gate Driver Outputs 122-1, . . . 122-8. In flexible designs, protected power devices 110-1, . . . 110-8 can be different. Such architectures allow an end user to "mix and match" the needed loads to the power devices. Eight individual current sensors 130-1, . . . 130-8 are coupled into control lines 101-1, . . . 101-8 to sense control lines currents $I_{CL}$-1, . . . $I_{CL}$-8. Current sensors 130 are coupled to control logic 140 individually, as indicated by the 8-wide "fault in" connection 131 in FIG. 3. "Fault in" connection 131 can be a bus, for example.

In some embodiments, control logic 140 includes a fault logic 141. Fault logic 141 is configured to generate a fault-response signal in response to the fault-sensing signal of current sensors 130. The fault-response signal can be at least one of: identifying the faulty power device, protecting the faulty power device and reporting the fault to another circuit block.

For example, in embodiments there can be a first and a second critical temperature $T_{max1}$ and $T_{max2}$. If the temperature of a protected power device 110-$i$ exceeds $T_{max1}$ then the fault-response of fault logic 141 using the fault information from bus line 131 can be just to report the identity of the faulty protected power device 110-$i$ to a logic circuit without turning off the protected power device 110-$i$. But if the temperature rises above $T_{max2}$, then the fault-response can be to turn off protected power device 110-$i$. The two critical temperatures can be sensed by the different control line currents $I_{CL1}$ and $I_{CL2}$ they draw.

In other embodiments, the fault-response of fault logic 141 may be to count how many times a particular protected power device 110-$i$ experienced an overheating fault. When a protected power device 110-$i$ experienced an overheating fault more than a preset number, then the protected power device 110-$i$ may be eliminated.

In other embodiments, the overheating may be the consequence of the failure of another device component, such as a cooling fan. In such cases, the fault-response of fault logic 141 may be to report the overheating information, which then can be used by an external control logic to implement a response action concerning the faulty cooling fan.

In some embodiments, fault logic 141 is coupled to a fault enable terminal 145 and a fault input terminal 146. Fault logic 141 generates the response signal depending on the fault-sensing signal of current sensors 130 and signals from fault enable terminal 145 and fault input terminal 146. For example, a control signal at fault enable terminal 145 can switch on or off the fault protection function, or it can select the fault-response to be a reporting step or a protecting step. A control signal at fault input terminal 146 can input additional protection information, such as signals from the flag terminals Flag1 of protected power devices 110-1, . . . 110-8.

In some embodiments fault logic 141 is coupled to a channel diagnostic register 142. Channel diagnostic register 142 receives and latches, or registers, the fault-response signal from fault logic 141.

Channel diagnostic register 142 can be coupled to a serial peripheral interface 143. Serial peripheral interface 143 receives the latched/registered response signal. Serial peripheral interface 143 includes a data-in terminal 147, a data-out terminal 148, a clock terminal 149, and a chip enable terminal 151.

Serial peripheral interface 143 performs input/output functions through data-in terminal 147 and data-out terminal 148, which can be coupled to an external logic circuit. Through data-out terminal 148 serial peripheral interface 143 can report the sensed fault and the response of protection circuit 100. Through data-in terminal 147 serial peripheral interface 143 can receive a modify signal from the logic circuit. In response to the modify signal, serial peripheral interface 143 is capable of modifying the response signal, latched in channel diagnostic register 142. For example, the fault-response signal of fault logic can be only to report an overheating fault without turning off the corresponding protected power device 110-$i$, but the external logic may modify this response to turning off the protected power device 110-$i$.

Receiving an external clock signal through clock terminal 149 allows serial peripheral interface 143 to perform its input/output functions in a synchronous manner, e.g. "to clock out" the fault-response signal. The chip enable signal, received through chip enable terminal 151 can enable or disable the operations of serial peripheral interface 143.

In some embodiments serial peripheral interface 143 is coupled to a channel driver register 144. Channel driver register 144 is configured to receive and latch the modified response signal from serial peripheral interface 143, and to forward the modified response signal to power device drivers 120. Power device drivers 120 are operable to drive power devices 110 according to the received modified response signals.

In some embodiments, power device protection circuit 100 includes a temperature-independent voltage generator 161, generating a temperature independent voltage $V_{Ref}$. Temperature-independent voltage generator 161 may be powered by an external voltage source, such as a battery or an ignition voltage at terminal Vbatt/Ign. However, these external voltage sources can be temperature dependent and quite noisy. Therefore, temperature-independent voltage generator 161 can have any one of the well known designs for generating a temperature independent voltage, such as the design of a band-gap reference voltage generator. The generated temperature-independent voltage $V_{Ref}$ is then output at reference voltage terminal 166 and coupled e.g. to protected power devices 110-1, . . . 110-8. Referring to FIG. 2, $V_{Ref}$ is coupled to terminal $V_{Ref}$1.

Protection circuit 100 can also include over/under voltage sensor 195, coupled to temperature-independent voltage generator 161 and to fault logic 141. Functions of over/under voltage sensor 195 include the generation of a "fault out" signal at a fault-out terminal 197 in response to a fault-response signal of fault logic 141, which signals to an external logic block that a fault occurred. The "fault-out" signal can prompt e.g. the external logic to start reading the signals at data-out terminal 148, which carry information about the fault and the system's fault-response. Having a digital over/under voltage sensor 195 in control logic 140 allows more precise operations than designs utilizing analog circuits, located on protected power devices 110. Also, in the embodiment of FIG. 3 there can be a single over/under voltage sensor 195, instead of 8, one on every protected power device 110, which would also require corresponding wire connections.

Figure 4:
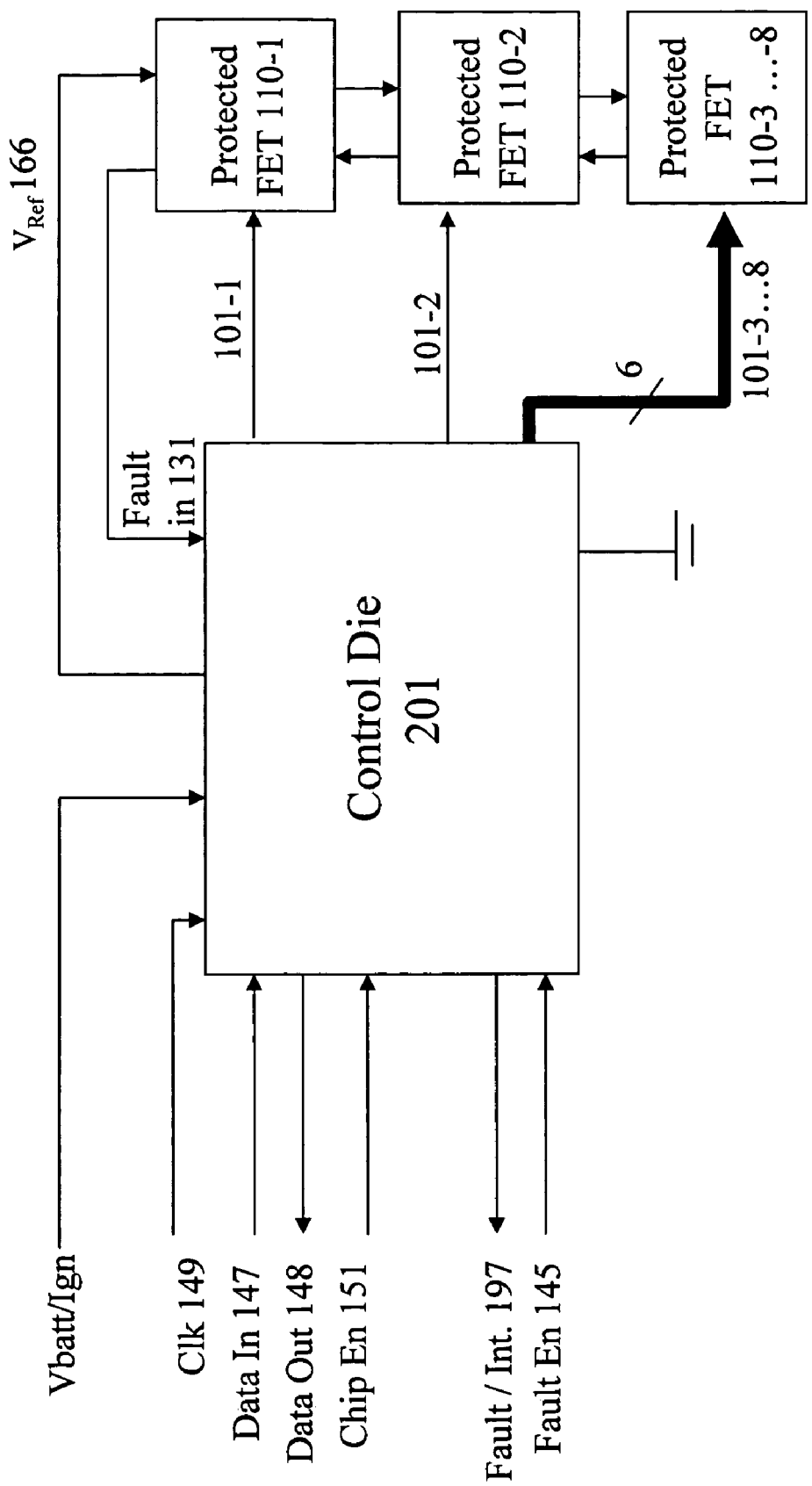
FIG. 4 illustrates an integrated device implementation of power device protection circuit according to embodiments of the invention.

FIG. 4 illustrates a power device protection circuit 100, useful for contrasting present embodiments with existing designs. In this embodiment power device drivers 120, current sensors 130 and control logic 140 are integrated on a single control die 201.

In some existing designs, protected power devices 110-1, . . . 110-8 are coupled in parallel or wired ored. In such designs, the fault signal of the 8 protected power devices 110-1, . . . 110-8, e.g. the signals at the flag terminals, are coupled together in a wired "or" configuration, and a single "fault in" signal is received by control die 201. In contrast, embodiments of the present invention have a "fault in" bus 131 containing separate signal lines for each protected power device 110-1, . . . 110-8. Such embodiments enable control logic 140 in control die 210 to generate an individual fault-response signal and execute it specifically on the faulty protected power device 110-$i$. Even if in existing designs such a "fault bus" were created, it would have to be external to control logic 140, requiring 8 pins and corresponding wiring, increasing the complexity of the system.

Figure 5:
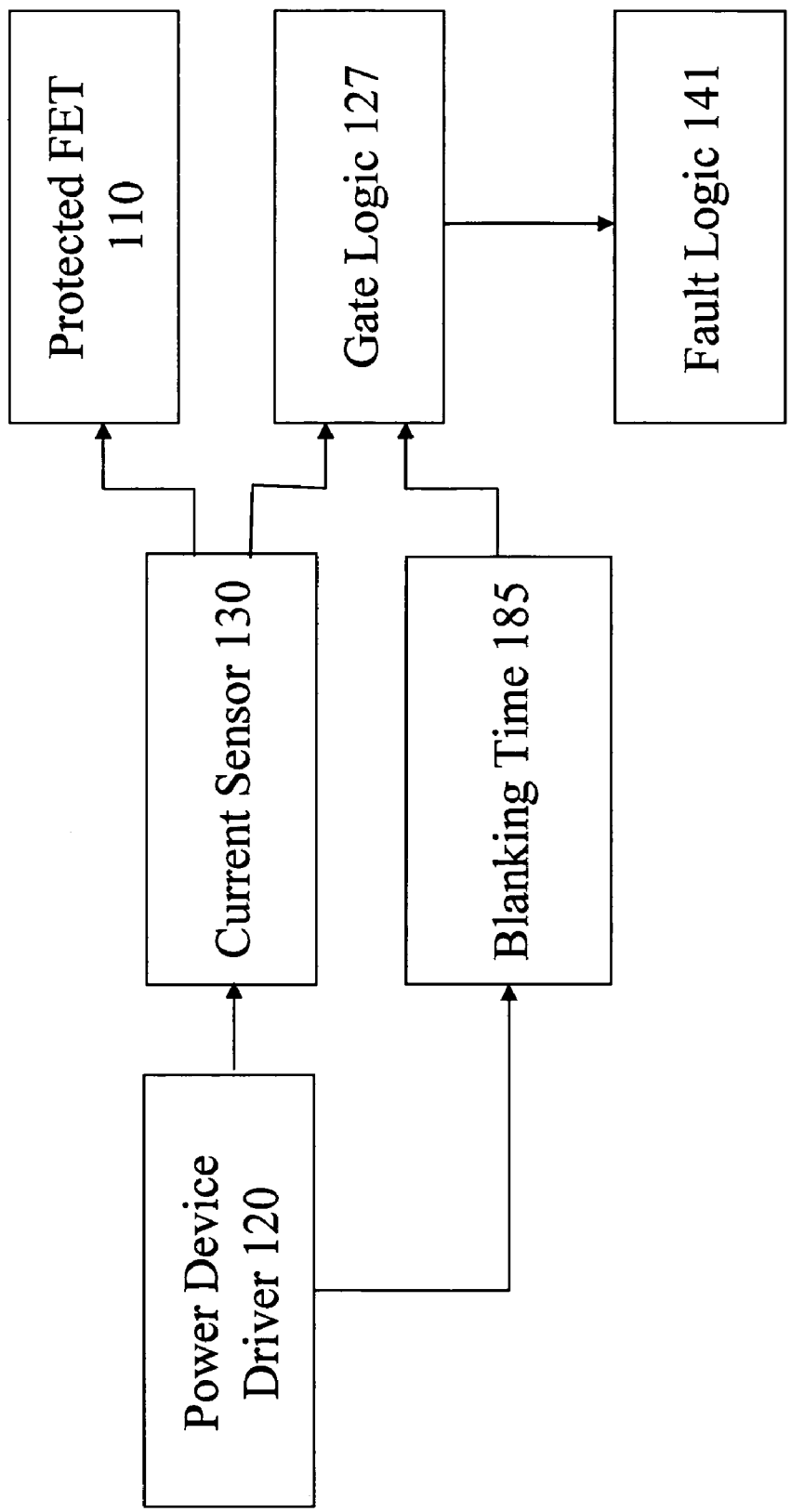
FIG. 5 illustrates an implementation of a blanking time embodiment according to an embodiment of the invention.

FIG. 5 illustrates an embodiment of power device protection circuit 100. This embodiment addresses a feature of the operation of power device protection circuit 100. During the startup of protection circuit 100 a control line current is flowing into protected power device 110 in order to charge or turn on the gate. This current is sensed by current sensor 130 and can be falsely reported as a fault-sensing signal to control logic 140. To prevent such malfunctions, current sensor 130 is coupled to fault logic 141 through gate logic 127. Power device driver 120 is also coupled into gate logic 127 through blanking time block 185.

In operation, current sensor 130 generates a fault-sensing signal towards fault logic 141 during start-up. However, power device driver 120 sends a signal to blanking time block 185 to signal that this is a start-up period. In response, blanking time block 185 generates a signal towards gate logic 127 to override the fault-sensing signal of current sensor 130 and not to report a fault to fault logic 141.

Figure 6:
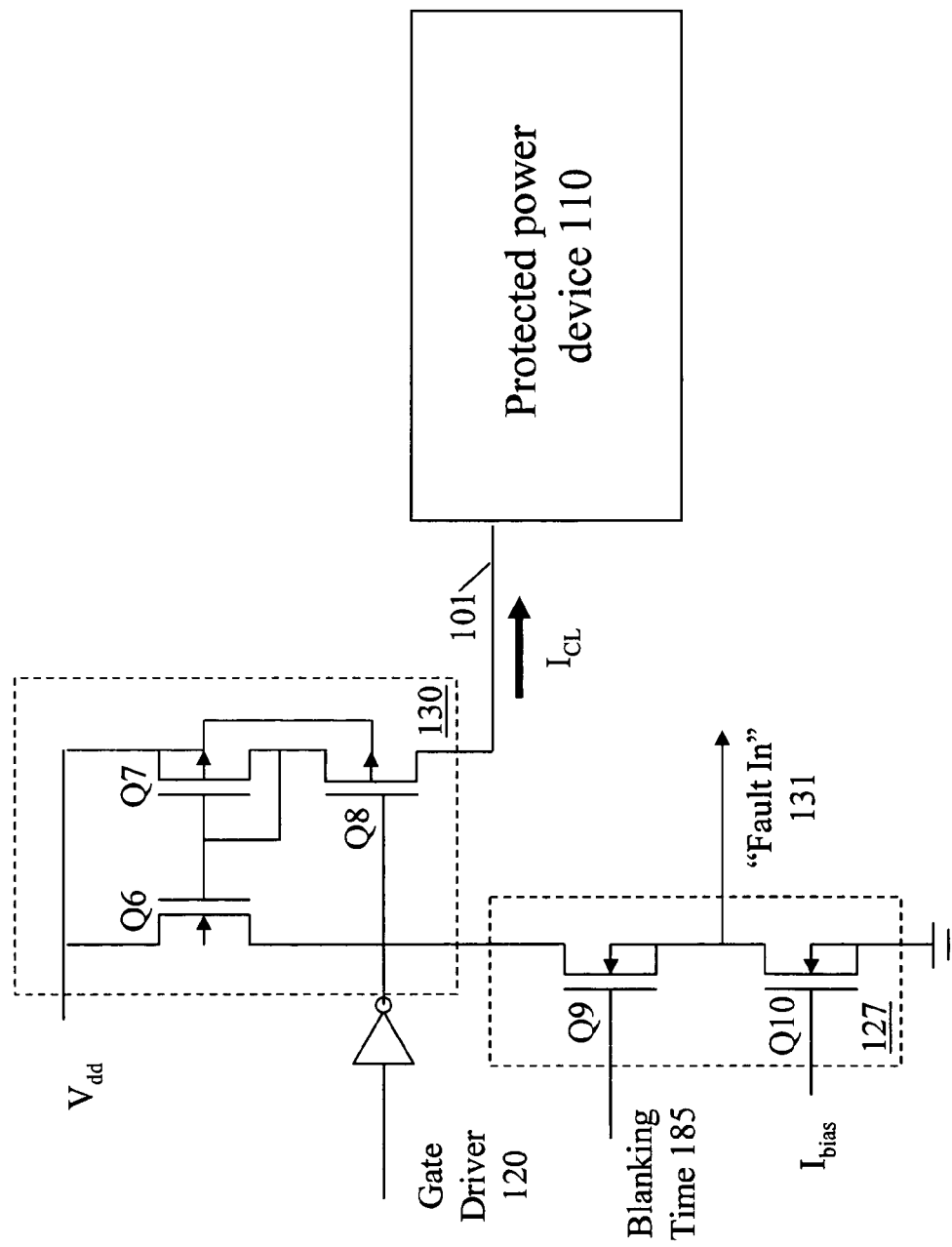
FIG. 6 illustrates an implementation of a blanking time and current sense embodiment according to an embodiment of the invention.

FIG. 6 illustrates an embodiment of the circuit of FIG. 5. Here current sensor 130 includes three transistors Q6, Q7, and Q8, configured to sense the control line current $I_{CL}$ in control line 101. Gate logic 127 is coupled to a blanking time block 185 at transistor Q9 and utilizes a bias current $I_{bias}$ at a transistor Q10. Gate logic 127 is coupled to fault logic 141 through the corresponding "fault in" link 131.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. Circuitry for protecting a power device, the protected power device comprising a power transistor having a control terminal, an internal control line coupled to the control terminal and operable to receive a control line current, and a fault detector coupled to the internal control line, the power device protection circuitry comprising:
a power device driver operable to drive the protected power device through a control line;
a current sensor coupled to the control line, the current sensor configured to sense a fault of the protected power device by monitoring current flowing through the control line; and to generate a fault-sensing signal; and
control logic coupled to the current sensor and to the power device driver, the control logic configured to respond to the fault-sensing signal of the current sensor, the control logic comprising a fault logic configured to generate a response signal in response to the fault-sensing signal, the response signal representing at least one of identifying the faulty power device, safeguarding the faulty protected power device and reporting the fault to an other circuit block; and
wherein the fault logic is coupled to a fault enable terminal and a fault input terminal;
wherein the fault logic generates the response signal depending on the fault-sensing signal and signals from the fault enable and fault input terminals.

2. Circuitry for protecting a power device, the protected power device comprising a power transistor having a control terminal, an internal control line coupled to the control terminal and operable to receive a control line current, and a fault detector coupled to the internal control line, the power device protection circuitry comprising:
a power device driver operable to drive the protected power device through a control line;
a current sensor coupled to the control line, the current sensor configured to sense a fault of the protected power device by monitoring current flowing through the control line and to generate a fault-sensing signal; and
control logic coupled to the current sensor and to the power device driver, the control logic configured to respond to the fault-sensing signal of the current sensor, the control logic comprising:
a fault logic configured to generate a response signal in response to the fault-sensing signal, the response signal representing at least one of identifying the faulty power device, safeguarding the faulty protected power device and reporting the fault to an other circuit block; and
a channel diagnostic register coupled to the fault logic and configured to receive the response signal.

3. The power device protection circuitry of claim 2, wherein the control logic comprises a serial peripheral interface coupled to the channel diagnostic register and configured to receive the registered response signal.

4. The power device protection circuitry of claim 3, wherein the serial peripheral interface comprises a chip enable terminal, a clock terminal, a data-in terminal and a data-out terminal; wherein the data-out terminal is configured to report the sensed fault and the response to a logic circuit and the data-in terminal is configured to receive a modify signal from the logic circuit, whereby the serial peripheral interface is configured to modify the registered response signal.

5. The power device protection circuitry of claim 4, comprising a channel driver register coupled to the serial peripheral interface to receive and latch the modified response signal, the channel driver register coupled to the power device drivers to relay the modified response signal, whereby the power device drivers are configured to drive the protected power devices according to the modified response signal.

6. Circuitry for protecting a power device, the protected power device comprising a power transistor having a control terminal, an internal control line coupled to the control terminal and operable to receive a control line current, and a fault detector coupled to the internal control line, wherein the control line current being non-zero during regular operation for charging time intervals, the power device protection circuit comprising:
a power device driver operable to drive the protected power device through a control line;
a current sensor coupled to the control line and configured to sense a fault of the protected power device by monitoring current flowing through the control line and to generate a fault-sensing signal;
control logic coupled to the current sensor and to the power device driver, the control logic configured to respond to the fault-sensing signal of the current sensor;
a gate logic coupled to the current sensor; and
a blanking time block coupled to the gate logic, the blanking time block configured to cause the gate logic to suppress the fault-sensing signal of the current sensor during the charging time intervals.

* * * * *